United States Patent [19]

Matsuoka

[11] Patent Number: 5,026,467
[45] Date of Patent: Jun. 25, 1991

[54] AUTOMATIC DEVELOPING APPARATUS

[75] Inventor: Yasuo Matsuoka, Kawasaki, Japan

[73] Assignee: Kabushiki Kaisha Toshiba, Kawasaki, Japan

[21] Appl. No.: 473,722

[22] Filed: Feb. 2, 1990

[30] Foreign Application Priority Data

Feb. 3, 1989 [JP] Japan ................................. 1-25225

[51] Int. Cl.$^5$ .................... C25D 21/14; C25D 21/10; G01N 27/02
[52] U.S. Cl. ................................... 204/194; 204/273; 324/439
[58] Field of Search .............................. 204/19.4, 273; 324/71.1, 425, 439

[56] References Cited

U.S. PATENT DOCUMENTS

| | | | |
|---|---|---|---|
| 3,531,252 | 9/1970 | Rivers | 324/439 |
| 4,102,756 | 7/1978 | Castellani et al. | 204/273 X |
| 4,497,692 | 2/1985 | Gelchinski et al. | 204/273 X |
| 4,755,844 | 7/1988 | Tsuchiya et al. | 354/317 |

Primary Examiner—Donald R. Valentine
Attorney, Agent, or Firm—Foley & Lardner

[57] ABSTRACT

An improvement in an automatic developing apparatus in which an electroconductive body upon which a predetermined pattern has been written on a resist film applied to a surface of that body, is placed in a solution of developer and containing an electrode, and then the value of the change of the current that flows between the electroconductive body and the electrode is used as the basis for then determining the point at which developing of the written pattern is completed is disclosed.

The automatic developing apparatus comprises
inclusion section for including an electrolytic substance into the developing solution,
detection section for detecting an electroconductive ratio of the developing solution, and
control section for controlling the inclusion section so that a value detected by detection section is used as the basis for controlling the electroconductive ratio of the developing solution so that there a developing completion point is clearly indicated.

5 Claims, 4 Drawing Sheets

AUTOMATIC DEVELOPING APPARATUS

BACKGROUND OF THE INVENTION

The present invention relates to an apparatus for automatically developing patterns that have been written, and a method for developing using the apparatus.

Known is art (such as Japanese Patent Laid Open No. 135838-1987) for immersing an electroconductive body upon which a predetermined pattern has been written on a resist film applied to a surface of that body, is placed in a solution of developer and containing an electrode, and then the value of the current that flows between the electrconductive body and the electrode is used as the basis for then determining the point at which developing of the written pattern is completed. In this art, an organic solvent in which an electrolytic substance has been added (such as methylisobutylketone containing a solution of 1 mM (mili Moll) tetrabutyl ammonium perchlorate) is used as the developing solution. In addition, MODEL-MX-1000N of Nagase Sangyo (K.K.) is one example of two liquids mixing system that is used for adding an electrolytic substance into an organic solvent or a developing solution.

In such developing solutions as these, when the electrode and the conductor upon which a pattern has been written, are immersed in the solution, the current that flows between the electroconductive body and the electrode shows a clear peak or peaks and so this peak is used to determine when the developing of the written pattern has been completed.

For an example, there is given a substrates upon which a plurality of patterns have been written, such as a photomask where chrome has been vapor-deposited onto a quartz base plate and then PMMA (polymethylmethacrylate) has been applied as the electron beam resist and patterns with 2 $\mu$m lines and spaces, patterns with 25 $\mu$m lines and spaces, and patterns with 100 $\mu$m lines and spaces are written on this PMMA. When developing using the above technologies is performed for this electroconductive substrate, the current that flows between the electrode and the electroconductive body is shown by $1_1$ of FIG. 4. This is to say that the respective peaks of A, B and C appear for patterns of 100 $\mu$m, 25 $\mu$m and 2 $\mu$m. Accordingly, if the point at which developing is completed is determined by simply using the peak as is performed using conventional art, point A is mistakenly determined at the point at which developing is completed despite the fact that the point at which developing is actually completed should be point C, as shown in FIG. 4, and thereby causes the problem of a resultant drop in the dimensional accuracy of the pattern.

This problem occurs because the developing solution itself has a high resistance and this causes charging of electrons resulting two electrical layers. This phenomenon often occurs when the sensitivity of the developing solution is raised too high.

SUMMARY OF THE INVENTION

Accordingly, it is an object of the present invention to provide an apparatus for automatically developing patterns that have been written, and a method for developing which can raise the dimensional accuracy of a pattern through correctly determining the point at which developing is completed for even the case where a plurality of patterns having different widths have been written.

According to the automatic developing apparatus of the present invention, the electroconductive ratio of the developing solution is controlled to the optimum by a control section that uses the detect value of a detector to detect the electroconductive ratio of the developing solution. With a developing solution for which the electroconductive ratio has been controlled to the optimum, there is no influence of charging of electrons in the developing solution and a clear peak which indicates a point when the developing is completed is observed so that it is possible to improve the dimensional accuracy even in cases when a plural number of patterns are to be written.

In addition, in the automatic developing method according to the present invention, the detected value for the electroconductive ratio of the developing solution is used as the basis for controlling the amount of electrolytic substance contained in the developing solution so that the electrocondutve ratio of the developing solution is optimal. The electrode and the conductor upon which a predetermined pattern has been written are immersed in a developing solution for which the electroconductive ratio has been controlled in this manner. Then, the value of the current the flows between the electrode and the conductor is used as the basis of determining the point at which the developing of the written pattern is completed. By this and for the reasons outlined above, it is possible to raise the degree of dimensional accuracy of the pattern even for cases where a plural number of patterns are written.

DESCRIPTION OF THE PREFERRED EMBODIMENT

Figure 1:
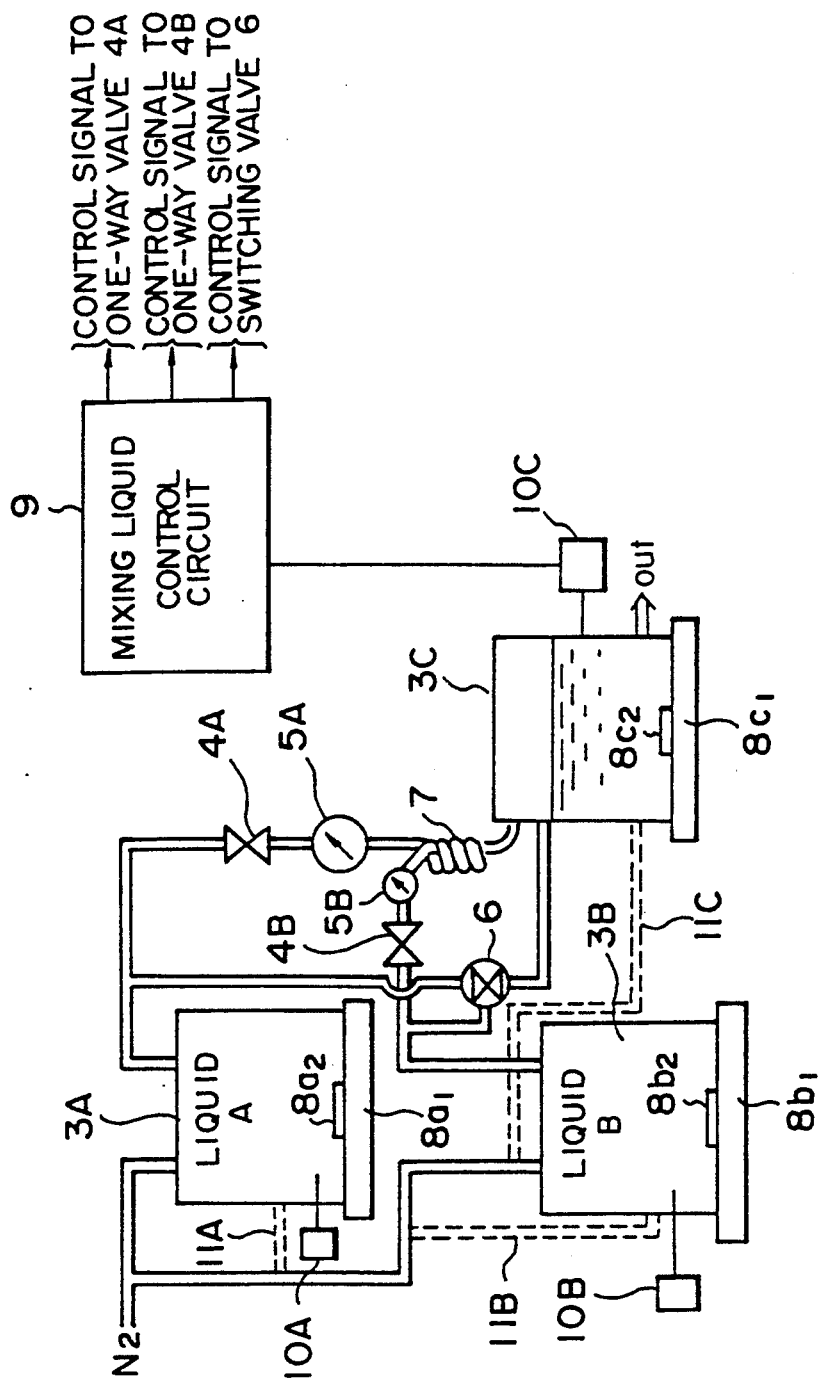
FIG. 1 is a view indicating a configuration of a developing solution preparation section of an embodiment of the automatic developing apparatus according to the present invention.

The following is a description of an embodiment of an automatic developing apparatus according to the present invention, with reference to the accompanying drawings. This automatic developing apparatus according to the present invention is provided with a developing solution preparation section and a developing section. FIG. 1 indicates the developing solution preparation section of this embodiment. In FIG. 1, compressed nitrogen is sent into tanks 3A and 3B containing liquids A and B (hereinafter referred to as a "liquid to be mixed") that have been prepared beforehand to have different electroconductive ratios. When this is performed, the liquids A and B contained in the tanks 3A and 3B respectively flow through one-way valves 4A and 4B, flowmeters 5A and 5B and via a spiral tube 7 into a mixing tank 3C to become the developing solution. When this occurs, the electroconductive ratios of liquids in the tanks 3A, 3B and 3C are respectively detected by electroconductive ratio measuring instruments 10A, 10B and 10C and the detected values are used as the basis for determining the settings for the degree of opening of the one-way valves 4A and 4B by a mixing liquid control circuit 9. After a predetermined amount of the developing solution is flown in the mixing tank 3C, the mixing liquid control circuit 9 controls the degree of opening of the one-way valves 4A and 4B to zero. Then, the mixing liquid control circuit 9 controls the switching valve 6 to flow liquid A or B for a small amount so that the electroconductive ratio of the liquid A or liquid B inside the mixing tank 3C is optimum (a predetermined value). Here, the electroconductive ratio that is thought optimum is within the range of from $2\mu$ S/cm (S means Siemens or mho) to $100\mu$ S/cm. Moreover, each of the tanks 3A, 3B and 3C are provided with agitators $8a_1$, $8b_1$ and $8c_1$ and agitator rods $8a_2$, $8b_2$ and $8c_2$ that are electromagnetically rotated. In addition, instead of using the above agitators and agitator rods, nitrogen ($N_2$) or some other gas can be bubbled through the tanks 3A, 3B and 3C from pipes 11A, 11B and 11C indicated by the dotted line in FIG. 1.

In addition, the developing solution preparation section can be a system as described above in which two liquids are mixed, but three or more liquids can also be mixed in order to give the optimum electroconductive ratio. Moreover, it is simple to produce a developing solution with the required electroconductive ratio when the electroconductive ratios of the respective liquids to be mixed differ by more than a factor of ten. Furthermore, from the viewpoint of operation, a commercially available developing solution that does not include the electrolytic substance can be used as either of the liquids to be mixed. In addition, if a commercially available developing solution is purchased and used, then, one which has an electrolytic substance (such as tetrabutyl ammonium perchlorate, for example) added so that the electroconductive ratio becomes approximately $300\mu$ S/cm can be purchased and used as one of the liquids for mixing.

Figure 2:
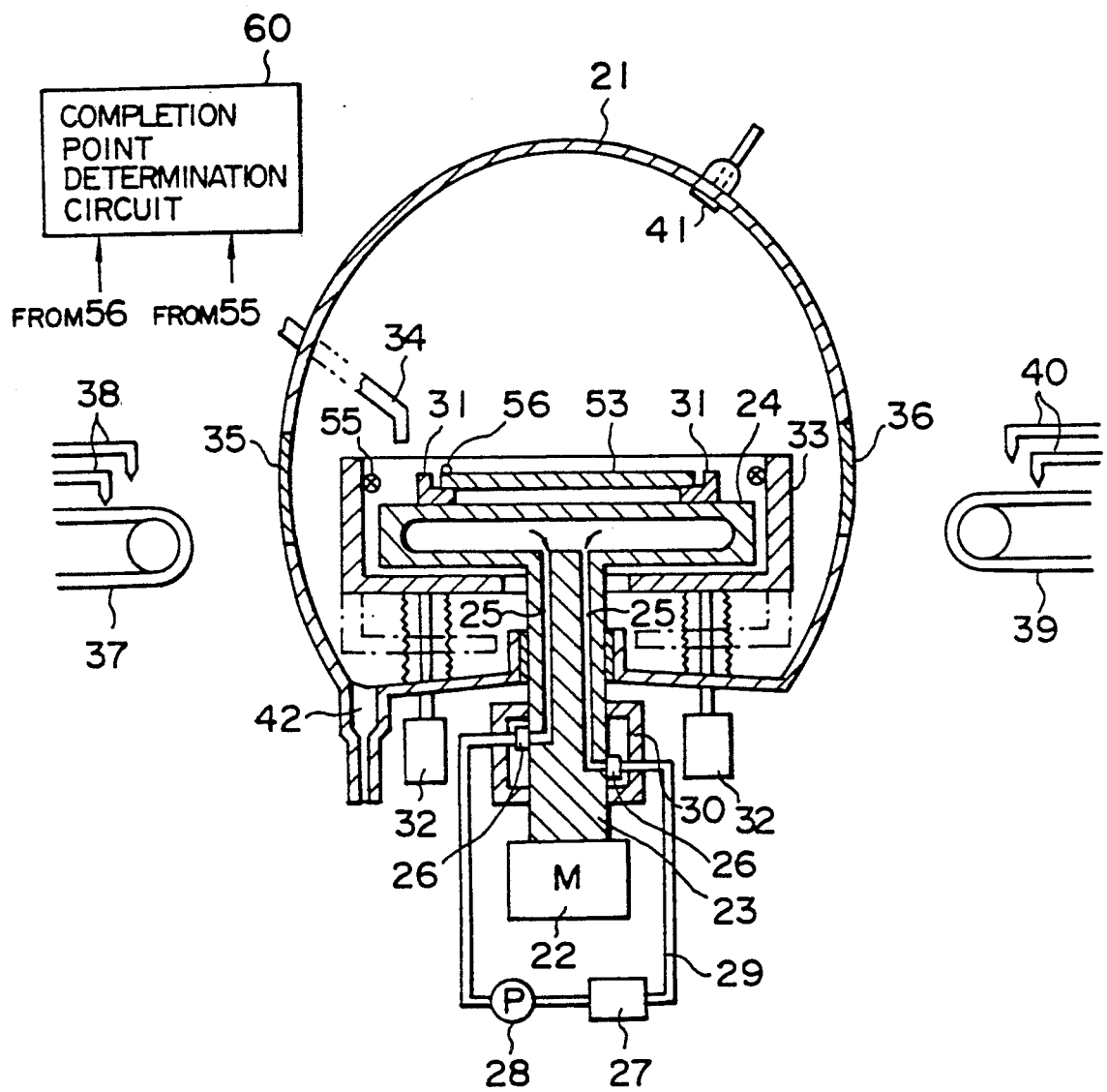
FIG. 2 and FIG. 3 are sectional views of developing sections of an embodiment of the automatic developing apparatus according to the present invention.
Figure 3:
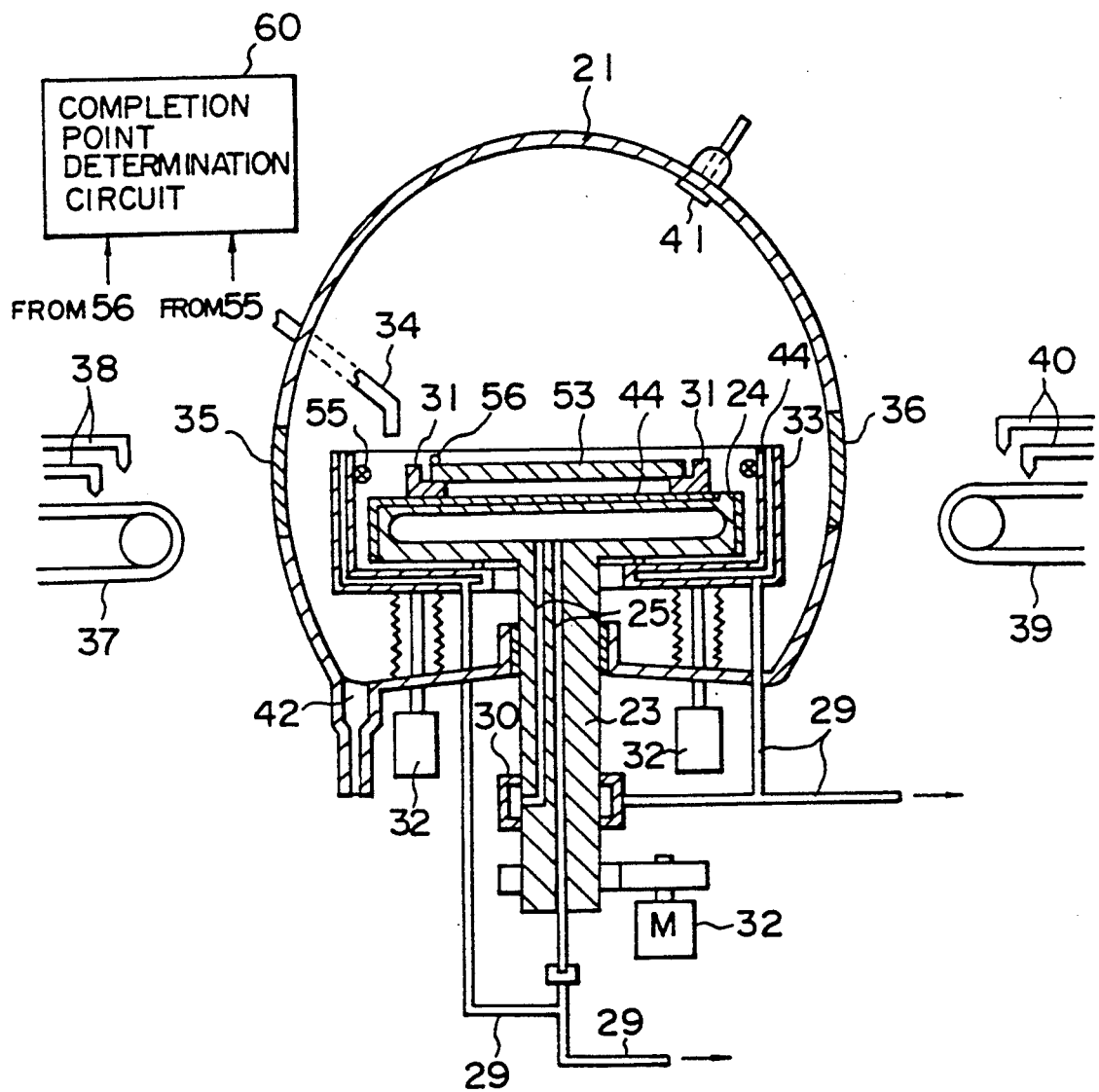

The following will be a description of a developing section of the developing apparatus according to the present invention, and with reference to FIG. 2 and FIG. 3. According to FIG. 2, a drive shaft 23 which rotates by the driving force of a motor 22 is inserted into a processing chamber 21 from the center of a bottom surface of the processing chamber 21, with the rotating drive shaft 23 having a flat stage 24 mounted to it. Inside these rotating drive shaft 23 and flat stage 24 is provided flow holes 25 through which flows water of a constant temperature and this flow holes 25 have openings on the surface of the sides of the rotating drive shaft 23 on the outside of the processing chamber 21, and is provided with connectors 26, 26 corresponding to these openings. These connectors 26, 26 are connected to a pipe 29 via an electronically-controlled isothermic tank 27 and a pump 28, and water at a constant temperature is supplied to the rotating drive shaft 23 and the flat stage 24. Moreover, in the vicinity of the openings of the flow holes 25 where connectors 26, 26 are provided, is a seal made of a seal material 30.

In addition, on top of the flat stage 24 are provided substrate-receiving fingers 31 and furthermore, the bottom portion of the processing chamber 21 is provided with cylinders 32, 32, the distal ends of which have mounted a processing frame 33 that surrounds the periphery of the flat stage 24. When this processing frame 33 is raised, the gap between the bottom surface of the flat stage 24 is airtightly sealed to form a tank for the development. Then, the processing chamber 21 is pierced and the inside of the developing solution tank formed by the flat stage 24 and the processing frame 33 is provided with a supply pipe 34 that supplies developing solution prepared by the developing solution preparation section indicated in FIG. 1.

In addition, a side wall of the processing chamber 21 is provided with a substrate take-in opening 35 and a substrate take-out opening 36. The outer side of the substrate take-out opening 36 is provided with a conveyor 37 and a take-in arm 38 to take a substrate which is, for example, a glass substrate with chromium film deposited thereon and which has been undergone the processes of having resin applied, being baked, and electron beam writting, into the processing chamber 21. In addition, the outer side of the substrate take-out opening 36 is provided with a conveyor 39 and a take-out arm 40 to take out the substrate from the processing chamber 21 and place it on the conveyor 39 which transports the substrate to the following process.

Furthermore, a top portion of the processing chamber 21 is provided with a nozzle 41 that sprays rinsing solution. The processing liquids such as the developing solution and the rinsing solution flow to the outside of the processing chamber 21 from a discharge opening 42 provided in the bottom portion of the processing chamber 21. Moreover, this discharge opening 42 may also be used as a discharge opening for the gas atmosphere inside the processing chamber 21.

The following describes the developing of a substrate using the developing apparatus described above.

First of all, the cylinders 32, 32 are operated and the processing frame 33 is raised so that a developing solution tank which is sealed so as to be airtight, is formed with the bottom surface of the flat stage 24. Then, the developing solution at a predetermined temperature is supplied from the supply pipe 34 to inside the developing tank formed by the flat stage 24 and the processing frame 33. Following this, after a cylinder and the like (not indicated in the figure) have opened the substrate take-in opening 35, the take-in arm 38 places a substrate 53 on the plate-receiving fingers 31 and the developing commences. Moreover, during the developing, in cases where a temperature sensor is immersed in the developing solution and the temperature of the developing solution becomes different from the set temperature, control signals are preferably fed back to a temperature control mechanism of the electronically-controlled isothermic tank 27 to accurately control the temperature of the developing solution. Then, the current that flows between the reference electrode 55 immersed in the developing solution and the conductor-side electrode 56 formed on the substrate is used as the basis for a developing completion point determination circuit 60 to determine the developing completion point for the pattern written on the resist applied to the substrate. Moreover, the formation of the conductor-side electrode 56 is disclosed in Japanese Patent Laid Open No. 138728-1988 and so will not be described further here. After the developing completion point has been determined, the cylinders 32, 32 are operated and the processing frame 33 are lowered so discharge the developing solution and end the developing. After this, the motor 22 is rotated to spray the rinsing liquid from the nozzle 41 and perform rinsing. Furthermore, the flat stage 24 is rotated at a high speed of about 2,000 rpm to dry the substrate 53. Then, the take-out arm 40 removes the substrate 53 from the substrate receiving fingers 31 and takes it to outside of the processing chamber 21 before it is mounted on the conveyor 39 and conveyed to the following process.

According to such an automatic developing apparatus, it is possible to automatically perform the immersion method by forming a developing tank through the raising of the processing frame 33, taking in the substrate 53, supplying developing solution, and discharging the developing solution by the lowering of the processing frame 33.

In addition, it is possible to perform immediate rinsing by spraying with the rinsing liquid from the nozzle 41, and so it is possible to achieve higher levels of accuracy with there being no dissolving of the resist pattern while the substrate 53 is under transportation.

Moreover, in the embodiment described above, flowing water of a constant temperature into the flat stage 24 performs temperature control of the developing solution during developing but the water of a constant temperature can also be supplied to the processing frame. The fluid used for temperature control is not limited to water as gasses, glycerine or some other heat transfer solvent can also be used. In addition, in the above embodiment, the temperature sensor was immersed in the developing solution and feedback control performed but this temperature sensor can also monitor the temperature of the developing solution, integrate it and perform compensation for developing time while developing is being performed.

Still furthermore, as indicated in FIG. 3, a thermoelectric element 44 can be disposed on the contact surface to the developing solution on the flat stage 24 and the processing frame 33 so that direct temperature control of the developing solution is performed. In this case, it is desirable that cooling air be blown into the pipe 29 and the flow hole 25 to cool the side opposite the contact surface with the thermoelectric element 44 so that the efficiency of the thermoelectric element 44 is raised.

Again furthermore, making temperature controlled inert gas, (such as nitrogen for example) flow around the processing frame 33 and by discharging the gas from the discharge opening 42 or other discharge outlet provided at a position other than that of the discharge opening 42 enables the temperature control of the developing solution to be performed more accurately. However, it is desirable to stop gas discharge during developing operation.

Figure 4:
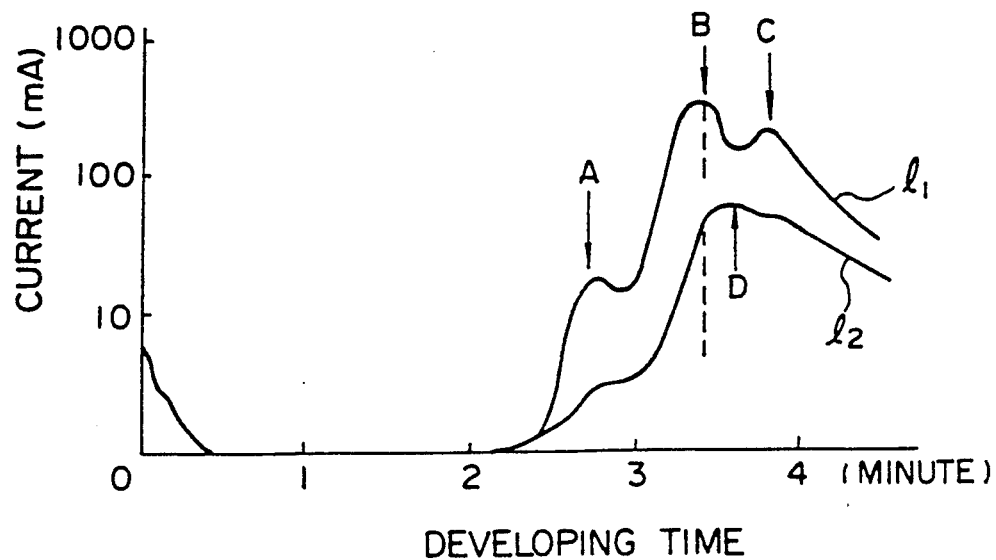
FIG. 4 is a graph indicating the changes in the current flowing between an electrode and a conductor for the cases when the automatic developing apparatus of an embodiment according to the present invention, and for when conventional art are used.
Figure 5:
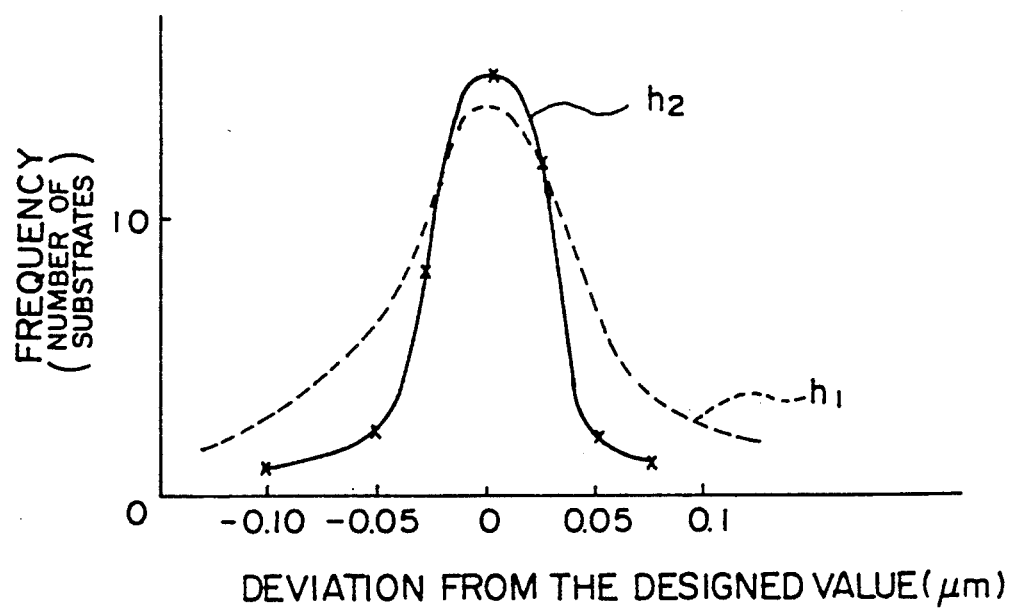
FIG. 5 is a graph showing a comparison of the dimensional accuracy of a pattern after developing, for the cases when the automatic developing apparatus of an embodiment according to the present invention, and for when conventional art are used.

As has been described above, in the automatic developing apparatus according to the present invention, it is possible to perform the developing of electroconductive substrates written with patterns having 2 $\mu$m lines and spaces, patterns with 25 $\mu$m lines and spaces and patterns with 100 $\mu$m lines and spaces so that an electroconductive ratio for the developing solution having the appropriate sensitivity can be manufactured with the current peak occurs between that of 25 $\mu$m patterns and that of 2 $\mu$m patterns (Refer to the point D of graph $l_2$ in FIG. 4). By doing this, as indicated in FIG. 5, the dimensional accuracy of patterns using the automatic developing apparatus according to the present embodiment (Refer to graph $h_2$) is better and has less dispersion than the dimensional accuracy of patterns employing conventional art (Refer to graph $h_1$).

As has been described above, according to the present embodiment, it is possible to manufacture a developing solution of the optimum electroconductive ratio for the types of patterns, the types of resist, and the process conditions, and to improve the dimensional accuracy of the pattern.

In addition, by controlling the electroconductive ratio, it is possible to estimate the influence of the proximity effect and other characteristics of electron beams or the status (such as the patterning ratio) of patterns exposed by electron beams, and thereby allow compensation depending upon the degree of such influence.

What is claimed is:

1. In an automatic developing apparatus in which an electroconductive body upon which a predetermined pattern has been written on a resist film applied to a surface of that body, is placed in a solution of developer and containing an electrode, and then the value of the change of the current that flows between the electroconductive body and the electrode is used as the basis for then determining the point at which developing of the written pattern is completed,
   wherein said automatic developing apparatus comprises;
   means for including a electrolytic substance into said developing solution,
   means for detecting an electroconductive ratio of said developing solution, and
   means for controlling said means for including so that a value detected by said means for detecting is used as the basis for controlling the electroconductive ratio of said developing solution so that there a developing completion point is clearly indicated.

2. The automatic developing apparatus as set forth in claim 1, wherein
   said means for including comprises means for mixing together a developing liquid that does not contain said electrolytic substance, and a developing liquid that does contain said electron releasing substance.

3. The automatic developing apparatus as set forth in claim 1, wherein
   said means for including comprises means for mixing together a plural number of liquids that have been adjusted beforehand and which have electroconductive ratios differing by more than a factor of ten.

4. The automatic developing apparatus as set forth in claim 1, wherein
   said means for including comprises a plurality of tanks containing solvents for the adjustment of the electroconductive ratios.

5. The automatic developing apparatus as set forth in claim 4, wherein
   said tanks have agitating means.

* * * * *